US009955611B2

(12) United States Patent
Tajima et al.

(10) Patent No.: US 9,955,611 B2
(45) Date of Patent: Apr. 24, 2018

(54) PRESSURE STRUCTURE AND PRESSURE UNIT

(71) Applicant: NHK Spring Co., Ltd., Yokohama-shi (JP)

(72) Inventors: Norihiro Tajima, Kanagawa (JP); Yusuke Terada, Kanagawa (JP); Yosuke Kawai, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 15/032,470

(22) PCT Filed: Oct. 28, 2014

(86) PCT No.: PCT/JP2014/078631
§ 371 (c)(1),
(2) Date: Apr. 27, 2016

(87) PCT Pub. No.: WO2015/064572
PCT Pub. Date: May 7, 2015

(65) Prior Publication Data
US 2016/0286687 A1     Sep. 29, 2016

(30) Foreign Application Priority Data
Oct. 28, 2013 (JP) ................................ 2013-223681

(51) Int. Cl.
*F16F 1/18*     (2006.01)
*F16F 3/02*     (2006.01)
(Continued)

(52) U.S. Cl.
CPC ........... *H05K 7/2049* (2013.01); *F16F 1/185* (2013.01); *F16F 3/023* (2013.01);
(Continued)

(58) Field of Classification Search
CPC . H05K 7/2049; H01L 23/4012; H01L 23/473; H01L 23/40; H01L 23/3675;
(Continued)

(56) References Cited

U.S. PATENT DOCUMENTS 1,630,459 A * 5/1927 Zeidler .................. D06F 83/00
267/80
2,277,853 A * 3/1942 Kohn .................... A47C 27/065
267/80
(Continued)

FOREIGN PATENT DOCUMENTS

CN    101026975 A    8/2007
EP    2688096 A1    1/2014
(Continued)

OTHER PUBLICATIONS

International Search Report dated Dec. 9, 2014, issued for PCT/JP2014/078631.
(Continued)

*Primary Examiner* — Robert A. Siconolfi
*Assistant Examiner* — San M Aung
(74) *Attorney, Agent, or Firm* — Locke Lord LLP

(57) ABSTRACT

A pressure structure which is arranged between a first pressed body and a second pressed body facing the first pressed body and applies a pressure to the first pressed body and the second pressed body includes: a first spring member including a center portion which is in contact with the first pressed body, two end portions, each of which is in contact with the second pressed body, and two arm portions which extend from the center portion toward the different end portions; and a second spring member including a center portion which is in contact with the second pressed body, two end portions, each of which is in contact with the first
(Continued)

pressed body, and two arm portions which extend from the center portion toward the different end portions.

16 Claims, 15 Drawing Sheets

(51) Int. Cl.
    *H05K 7/20*     (2006.01)
    *H01L 23/473*     (2006.01)
    *H01L 23/40*     (2006.01)
    *H01L 23/367*     (2006.01)
    *H01L 25/10*     (2006.01)

(52) U.S. Cl.
    CPC .......... *H01L 23/3675* (2013.01); *H01L 23/40* (2013.01); *H01L 23/4012* (2013.01); *H01L 23/473* (2013.01); *H01L 25/105* (2013.01); *H01L 2023/4068* (2013.01); *H01L 2225/1094* (2013.01); *H01L 2924/0002* (2013.01)

(58) Field of Classification Search
    CPC ..... H01L 2023/4068; H01L 2225/1049; H01L 2924/00; H01L 2924/0002; F16F 1/185; F16F 3/023
    USPC .................. 267/165, 145, 141, 73, 142, 143, 267/151–153
    See application file for complete search history.

(56) References Cited

U.S. PATENT DOCUMENTS

| | | | | |
|---|---|---|---|---|
| 4,713,854 A | * | 12/1987 | Graebe | A47C 27/144 297/DIG. 1 |
| 6,832,979 B1 | * | 12/2004 | Yarbrough | A63B 5/00 482/121 |
| 2006/0065499 A1 | * | 3/2006 | Smaldone | A43B 13/183 188/372 |
| 2008/0098619 A1 | * | 5/2008 | Smaldone | A43B 13/183 36/28 |
| 2011/0194247 A1 | | 8/2011 | Nakasaka et al. | |
| 2013/0228959 A1 | * | 9/2013 | Bock | A47C 23/002 267/80 |
| 2014/0001630 A1 | | 1/2014 | Takamura et al. | |

FOREIGN PATENT DOCUMENTS

| | | |
|---|---|---|
| JP | 63-030618 A | 2/1988 |
| JP | 09-032874 A | 2/1997 |
| JP | 10-098140 A | 4/1998 |
| JP | 2001-094280 A | 4/2001 |
| JP | 2001-250895 A | 9/2001 |
| JP | 2001-358482 A | 12/2001 |
| JP | 2013-118334 A | 6/2013 |
| WO | 2012-124783 A1 | 9/2012 |

OTHER PUBLICATIONS

Supplementary European Search Report dated Jun. 19, 2017, issued for the European patent application No. 14858612.6.

Office Action dated Nov. 17, 2017, issued for the Chinese patent application No. 201480058579.5 and English translation thereof.

* cited by examiner

PRESSURE STRUCTURE AND PRESSURE UNIT

FIELD

The invention relates to a pressure structure and a pressure unit.

BACKGROUND

A pressure structure, which is provided between a first pressed body and a second pressed body and presses any one thereof or the both, has been known. The pressure structure is used in various devices. For example, a technique has been known in which a unit which requires cooling is brought into close contact with a heat sink using a pressure structure provided with a plurality of leaf springs being arranged side by side (for example, see Patent Literature 1).

FIG. 18A is a plan view illustrating an arrangement example of the leaf springs of the conventional pressure structure. FIG. 18B is a side view illustrating a pressure unit which uses the conventional pressure structure illustrated in FIG. 18A.

As illustrated in FIG. 18A, a conventional pressure structure 500 is configured such that a plurality of leaf springs 501 are arranged side by side to be parallel in the longitudinal direction. As illustrated in FIG. 18B, the pressure structure 500 is arranged between a first pressed body 502 and a second pressed body 503 and applies a pressure to any one or the both members.

The leaf spring 501 includes a center portion which is in contact with the first pressed body 502, end portions, each of which is in contact with the second pressed body 503 to be slidable, and an arm portion which connects the center portion and each of the end portions and is curved or bent so that the end portions face each other with the center portion as the center thereof. A pressure area PP, at which the first pressed body 502 serving as a pressed member is pressed, is positioned at the center portion of the leaf spring 501 as illustrated in FIGS. 18A and 18B.

CITATION LIST

Patent Literature

Patent Literature 1: Japanese Laid-open Patent Publication No. 2001-94280

SUMMARY

Technical Problem

As illustrated in FIG. 18A, the conventional pressure structure 500 is arranged such that all the center portions of the plurality of leaf springs 501 abut on the first pressed body 502, and accordingly, the surface pressure distribution is concentrated only on the center portion of the first pressed body 502, which generate a deviation.

The invention has been made in view of the above-described circumstances and an objective thereof is to provide a pressure structure capable of uniformizing surface pressure distribution and a pressure unit which uses the pressure structure.

Solution to Problem

To solve the above-described problem and achieve the objet, a pressure structure according to the present invention is arranged between a first pressed body and a second pressed body facing the first pressed body and applies a pressure to the first pressed body and the second pressed body. The pressure structure includes: a first spring member including: a center portion which is in contact with the first pressed body; two end portions, each of which is in contact with the second pressed body; and two arm portions which extend from the center portion toward the different end portions; and a second spring member including: a center portion which is in contact with the second pressed body; two end portions, each of which is in contact with the first pressed body; and two arm portions which extend from the center portion toward the different end portions.

In the pressure structure according to the present invention, the first spring member and the second spring member are alternately arranged in their width directions.

In the pressure structure according to the present invention, the first spring member and the second spring member are alternately arranged in their width directions to allow a part of the center portion of the first spring member to overlap a part of the center portion of the second spring member when seen from the first or second pressed body, and the first spring member and the second spring member have shapes in which the respective arm portions thereof do not interfere with each other at least without a load.

In the pressure structure according to the present invention, each of the arm portions of the first spring member and the second spring member includes a part with a width narrower than a width of the center portion.

In the pressure structure according to the present invention, each of the first spring member and the second spring member has a shape in which each width of the arm portions decreases from the center portion toward the end portion.

In the pressure structure according to the present invention, the first spring member and the second spring member have a same shape.

The pressure structure according to the present invention further includes a positioning unit configured to position the first spring member and the second spring member.

In the pressure structure according to the present invention, the positioning unit is inserted into a space formed between the center portion of the first spring member and the center portion of the second spring member.

A pressure unit according to the present invention includes: a first pressed body; a second pressed body facing the first pressed body; and a pressure structure that is arranged between the first pressed body and the second pressed body, and applies a pressure to the first pressed body and the second pressed body.

Advantageous Effects of Invention

According to the invention, it is possible to provide the pressure structure capable of uniformizing the surface pressure distribution and the pressure unit which uses the pressure structure.

DESCRIPTION OF EMBODIMENTS

Figure 1:
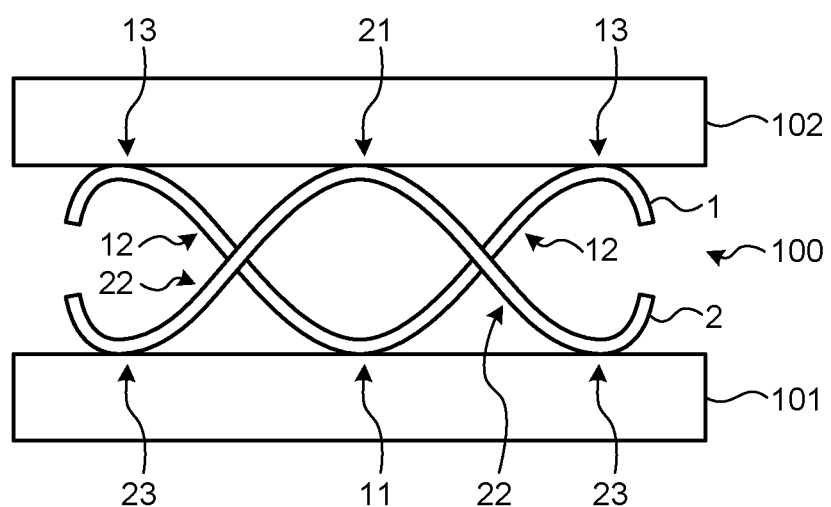
FIG. 1 is a side view schematically illustrating a pressure unit which uses a pressure structure according to a first embodiment of the present invention.

In the above description, a pressure structure which uses a leaf spring will be described as a mode for embodying the present invention (hereinafter, referred as an "embodiment"). In addition, the invention is not limited to the embodiment. Further, in the description of the drawings, the same parts are attached with the same reference numerals. Further, the drawings are schematically illustrated, and it is necessary to note that a relation between a thickness and a width of each member and a ratio among the respective members in the drawings are different from those in practice. In addition, parts with dimensions and the ratios being different from each other may be included in the drawings.

First Embodiment

Figure 2A:
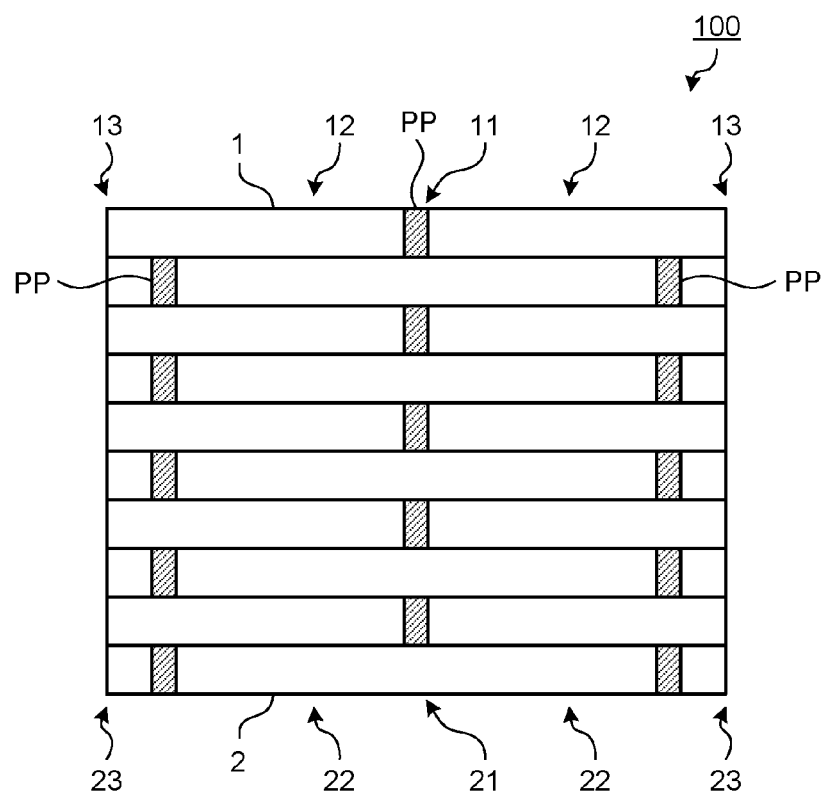
FIG. 2A is a plan view of the pressure structure illustrated in FIG. 1.
Figure 2B:
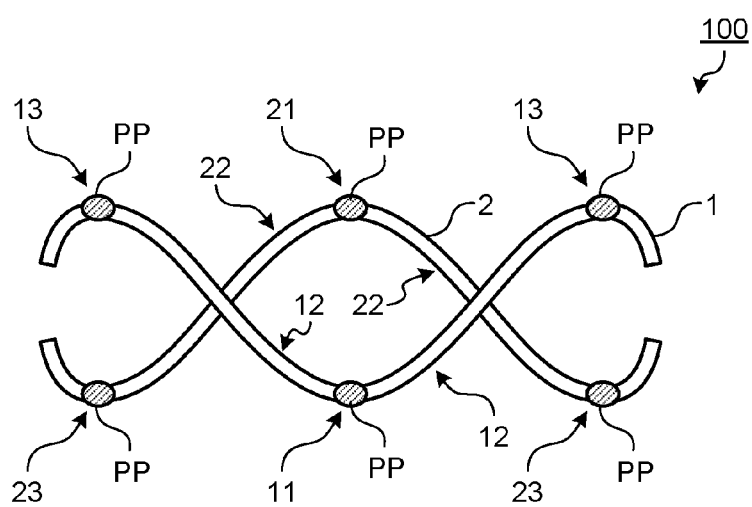
FIG. 2B is a side view of the pressure structure illustrated in FIG. 1.

FIG. 1 is a side view schematically illustrating a pressure unit which uses a pressure structure according to a first embodiment of the present invention. FIG. 2A is a plan view of the pressure structure illustrated in FIG. 1. FIG. 2B is a side view of the pressure structure illustrated in FIG. 1.

A pressure structure 100 according to the first embodiment of the present invention is configured such that a first spring member 1 and a second spring member 2 are alternately arranged in the width direction. In the pressure unit according to first embodiment, the pressure structure 100 is arranged between a first pressed body 101 and a second pressed body 102 which face each other. The pressure structure 100 applies a pressure to both the first pressed body 101 and the second pressed body 102 using an elastic force of the first spring member 1 and the second spring member 2.

Any one of the first pressed body 101 and the second pressed body 102 is provided with a positioning unit configured to maintain a predetermined interval between the first spring member 1 and the second spring member 2 and preventing the first spring member 1 and the second spring member 2 from being shifted in the width direction. As the positioning unit, a positioning protrusion may be provided in any one of the first pressed body 101 and the second pressed body 102, and a groove for allowing the protrusion to be embedded may be provided in the first spring member 1 and the second spring member 2, or ribs with the same interval may be provided in any one of the first pressed body 101 and the second pressed body 102 so that the first spring member 1 and the second spring member 2 may be arranged therebetween. In addition, a positioning unit, to be described later, according to a second embodiment or a third embodiment may be also used.

The first spring member 1 is, for example, a leaf spring which is made of a metal material, for example, spring steel or a resin material. The first spring member 1 includes a center portion 11 which is in contact with the first pressed body 101, two end portions 13, each of which is in contact with the second pressed body 102 to be slidable, and two arm portions 12 which extend from the center portion 11 toward the different end portions 13 and connects the center portion 11 and the end portions 13. The first spring member 1 has a rectangular shape in which each width of the center portion 11, the arm portion 12, and both the end portions 13 is uniform when seen from the top, and has a curved or bent shape to allow the arm portions 12 to face each other with the center portion 11 as the center thereof when seen from the side. The first spring member 1 has a shape in which a spring height thereof is the highest at each contact point (pressure area PP) between both the end portions 13 and the second pressed body 102 and is the lowest at a contact point (pressure area PP) between the center portion 11 and first pressed body 101. The pressure area PP, at which the first pressed body 101 is pressed, is positioned at the center portion 11 of the first spring member 1 as illustrated in FIGS. 2A and 2B. In addition, the pressure areas PP, at which the second pressed body 102 is pressed, are positioned at the end portions 13 of the first spring member 1.

The second spring member 2 is a member which is made of the same material and in a same shape as those of the first spring member 1. The second spring member 2 is arranged in a direction to be reversed upside down (direction with the reversed curve direction) with respect to the first spring member 1. Incidentally, the arrangement of the first spring member 1 will be called an upward direction, and the arrangement of the second spring member 2 will be called a downward direction in the present specification. Since the second spring member 2 is arranged in the downward direction, the pressure areas PP, at which the first pressed body 101 is pressed, are positioned at both the end portions 23 of the second spring member 2 as illustrated in FIGS. 2A and 2B. In addition, the pressure area PP, at which the second pressed body 102 is pressed, is positioned at the center portion 21 of the second spring member 2.

In the first embodiment, the first spring member 1 in the upward direction and the second spring member 2 in the downward direction are alternately arranged side by side in the width direction as illustrated in FIG. 2A. Incidentally, the first spring member 1 and the second spring member 2 are arranged with a predetermined interval (clearance α) as illustrated in FIG. 3B, in practice. Incidentally, the first spring member 1 in the upward direction and the second spring member 2 in the downward direction are not necessarily arranged side by side to be alternate one by one, but the number and arrangement of the spring members may be appropriately changed so as to obtain a desired surface pressure distribution, for example, in such a manner that the first spring member and the second spring member are arranged side by side to be alternate two by two, or the different number of both the members are arranged side by side.

The pressure area PP, at which the first spring member 1 applies a pressure to the first pressed body 101, is positioned at the center portion of the first pressed body 101, and on the other hand, the pressure areas PP, at which the second spring member 2 applies a pressure to the first pressed body 101, are positioned at both the end portions of the first pressed body 101. In addition, the pressure areas PP, at which the first spring member 1 applies a pressure to the second pressed body 102, are positioned at both the end portions of the second pressed body 102, and on the other hand, the pressure area, at which the second spring member 2 applies a pressure to the second pressed body 102, is positioned at the center portion of the second pressed body 102.

In the first embodiment, the first spring member 1 in the upward direction and the second spring member 2 in the downward direction are alternately arranged side by side in the width direction, and accordingly, the pressure areas PP against the first pressed body 101 and the second pressed body 102 are dispersed to the center portion and both the end portions, and thus, the surface pressure distribution is uniformized. Incidentally, when each number of the first spring members 1 and the number of the second spring members 2 is increased and the interval between the pressure areas PP is narrowed by narrowing each width of the first spring member 1 and the second spring member 2, it is possible to further improve the uniformity of the surface pressure distribution.

In the first embodiment, the widths of the first spring member 1 and the second spring member 2 are formed to be narrowed so as to increase the number of the spring members in the same area (division number), whereby it is possible to further improve the uniformity of the surface pressure distribution. However, it is necessary to provide the predetermined interval (clearance α) between the adjacent spring members in a case in which a plurality of the spring members 1 and a plurality of the spring members 2 are arranged side by side. Thus, when each number of spring members 1 and 2 (division number) is increased, the sum of the clearance α increases, and thus, a load per unit area decreases in the pressure structure 100 in which the plurality of spring members 1 and 2 are arranged.

Figure 3A:
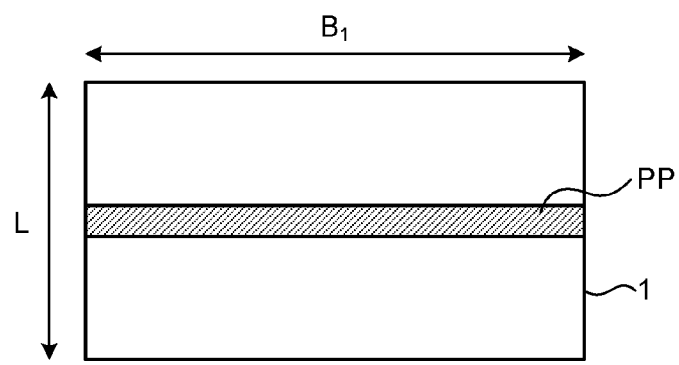
FIG. 3A is a plan view schematically illustrating an arrangement area in the case of using only one spring member.
Figure 3B:
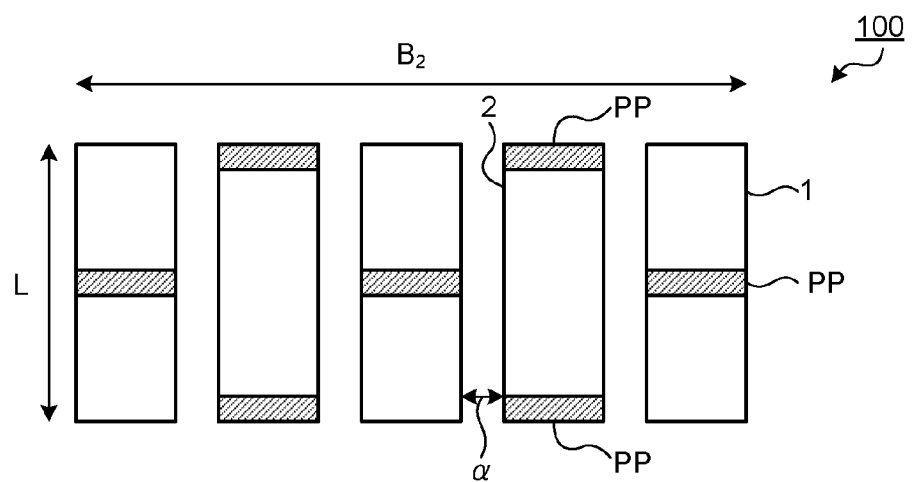
FIG. 3B is a plan view schematically illustrating an arrangement area in a case in which five spring members are arranged side by side in the first embodiment.

FIG. 3A is a plan view schematically illustrating an arrangement area in the case of using only one spring member. When a width of the pressure structure (the same as the width of the spring member 1 in this case) is set as $B_1$ and the entire length of the pressure structure (the same as the entire length of the spring member) is set as L, an arrangement area $S_1$ of the spring member 1 in the pressure structure is obtained by the following Formula (1).

$$S_1 = L \times B_1 \quad (1)$$

In addition, when a total spring load of the pressure structure is set as $F_0$, a load per unit area $P_1$ is obtained by the following Formula (2).

$$P_1 = F_0/S_1 \quad (2)$$

Here, when the spring member 1 illustrated in FIG. 3A is set to have the width $B_1$ of 100 mm, the entire length L of 50 mm, and the total spring load $F_0$ of 5000 N, it is found out that the load per unit area $P_1$ [N/mm$^2$] is 1.00 [N/mm$^2$] by the following Formula (3).

$$P_1 = 5000/(100 \times 50) = 1.00 \text{ [N/mm}^2\text{]} \quad (3)$$

FIG. 3B is a plan view schematically illustrating the arrangement area in a case in which the five spring members are arranged side by side in the first embodiment. In the pressure structure 100 illustrated in FIG. 3B, the three first spring members 1 and the two second spring members 2 are alternately arranged side by side in the width direction. Incidentally, the predetermined interval (clearance α) is provided between the first spring member 1 and the second spring member 2.

Here, when each of the first spring members 1 and the second spring members 2 illustrated in FIG. 3B is set to have each width of 20 mm and the clearance α of 0.4 mm and a division number is set as n, in general, the width $B_2$ of the pressure structure 100 satisfies $B_2 = B_1 + (n-1)\alpha$, and thus, $B_2 = (20 \times 5) + (4 \times 0.4) = 101.6$ mm. In addition, when the pressure structure 100 is set to have the entire length L of 50 mm and the total spring load $F_0$ of 5000 N (each of the first spring members 1 and the second spring members 2 has the spring load F of 1000 N), it is found out that the load per unit area $P_2$ [N/mm$^2$] is 0.98 [N/mm$^2$] using the following Formula (4).

$$P_2 = 5000/(101.6 \times 50) = 0.98 \text{ [N/mm}^2\text{]} \quad (4)$$

Incidentally, it is possible to increase the number of the contact areas in a case in which the division number is ten, and the five first spring members 1 and the five second spring member 2 are alternately arranged side by side in the width direction, and thus, it is possible to further uniformize the surface pressure distribution, but the load per unit area is further decreased as described below. When each of the first spring members 1 and the second spring members 2 has the width of 10 mm and the clearance α of 0.4 mm and the division number is set as n, in general, the width $B_2$ of the pressure structure 100 satisfies $B_2=B_1+(n-1)\alpha$, and thus, $B_2=(10\times10)+(9\times0.4)=103.6$ mm. In addition, when the pressure structure 100 has the entire length L of 50 mm and the total spring load $F_0$ of 5000 N (each of the first spring member 1 and the second spring member 2 has the spring load F of 500 N), it is found out that the load per unit area $P_2$ [N/mm$^2$] is approximately 0.97 [N/mm$^2$] by the following Formula (5).

$$P_2=5000/(103.6\times50)=0.965 \text{ [N/mm}^2\text{]} \qquad (5)$$

As in the first embodiment, it is necessary to provide the clearance α between the first spring member 1 and the second spring member 2 when the three first spring members 1 and two second spring members 2 are used in the state of being alternately arranged side by side in the width direction. Accordingly, it is possible to uniformize the surface pressure distribution in the case of the five-division illustrated in FIG. 3B, but the load per unit area $P_2$ is decreased to 0.98 [N/mm$^2$] considering that the load per unit area $P_1$ is 1.00 [N/mm$^2$] in a case in which the spring members is not divided (a case in which the pressure structure is configured of the single spring member). In the case of the ten-division, it is possible to further uniformize the surface pressure distribution than in the case of the five-division, but the load per unit area $P_2$ [N/mm$^2$] is further decreased than that in the case of five-division to be approximately 0.97 [N/mm$^2$].

Second Embodiment

As described above, it is possible to achieve the uniformity of the surface pressure distribution in the first embodiment, but the load per unit area is decreased. Thus, the number of the spring members to be arranged in the same area is increased to realize the uniformity of the surface pressure distribution in a second embodiment without decreasing the load per unit area.

Figure 4:
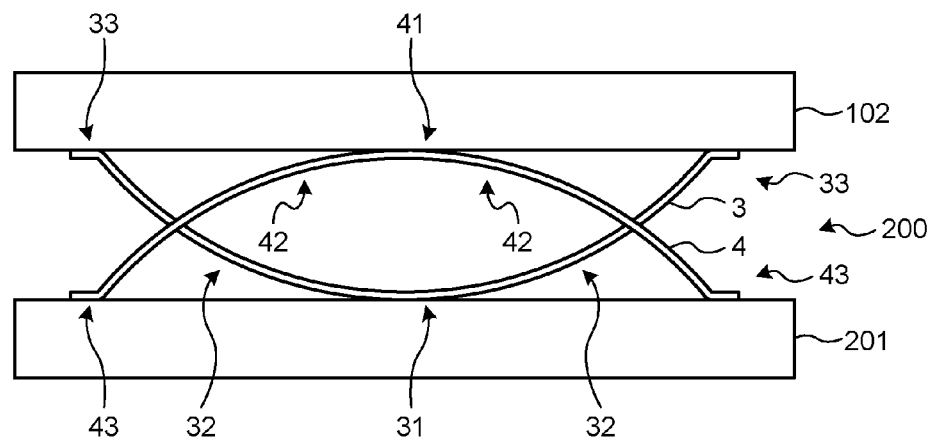
FIG. 4 is a side view schematically illustrating the pressure unit which uses a pressure structure according to a second embodiment of the present invention.
Figure 5:
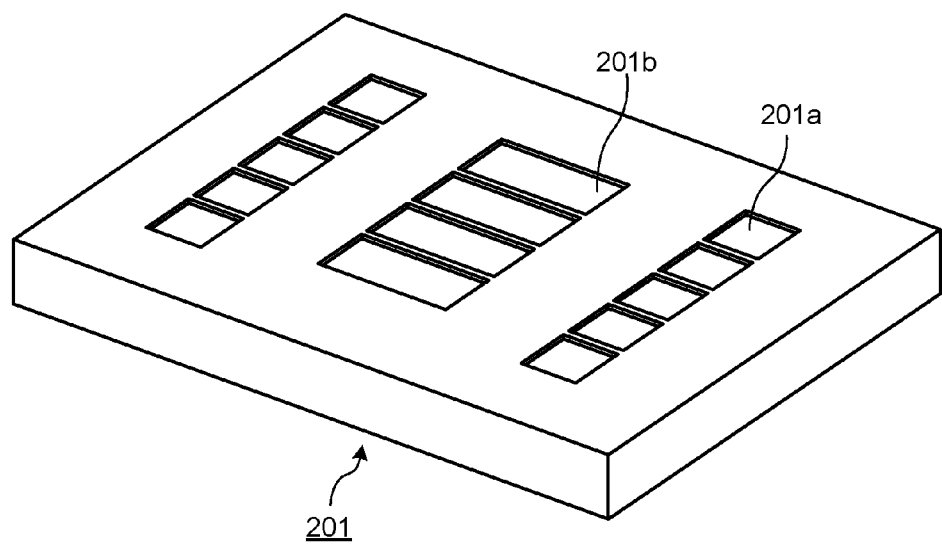
FIG. 5 is a perspective view of a first pressed body according to the second embodiment of the present invention.
Figure 6A:
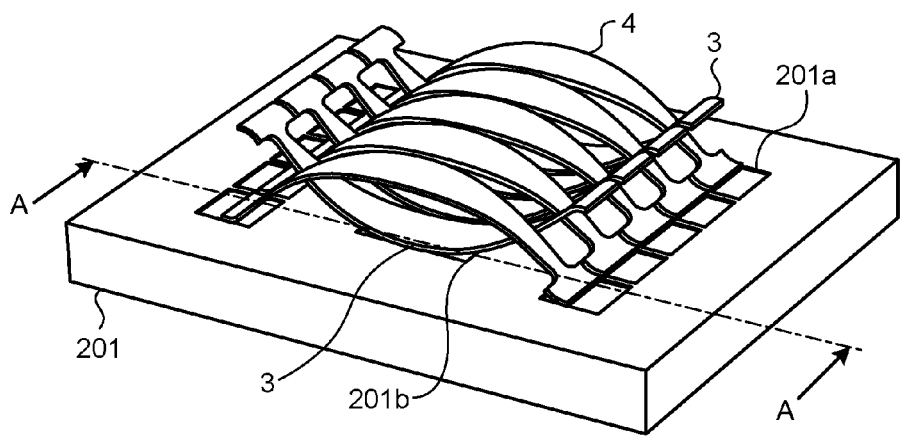
FIG. 6A is a perspective view in a state in which the pressure structure illustrated in FIG. 4 is provided in the first pressed body.
Figure 6B:
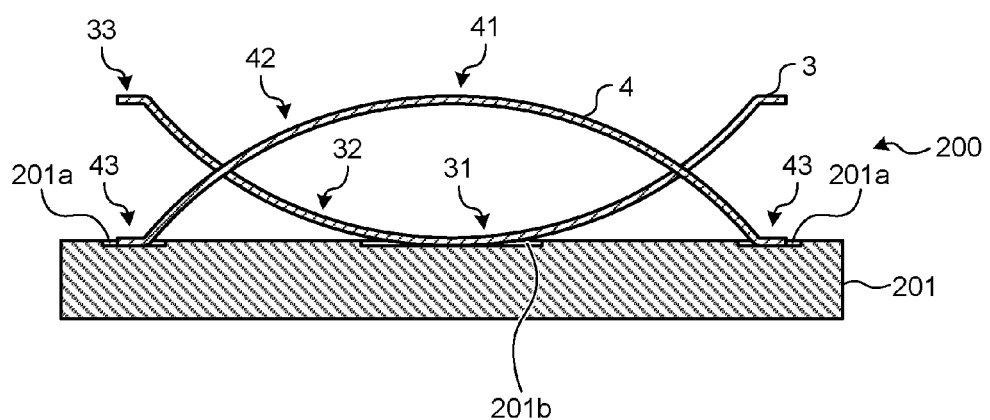
FIG. 6B is a cross-sectional view taken along a line A-A in the state illustrated in FIG. 6A in which the pressure structure is provided in the first pressed body.
Figure 7A:
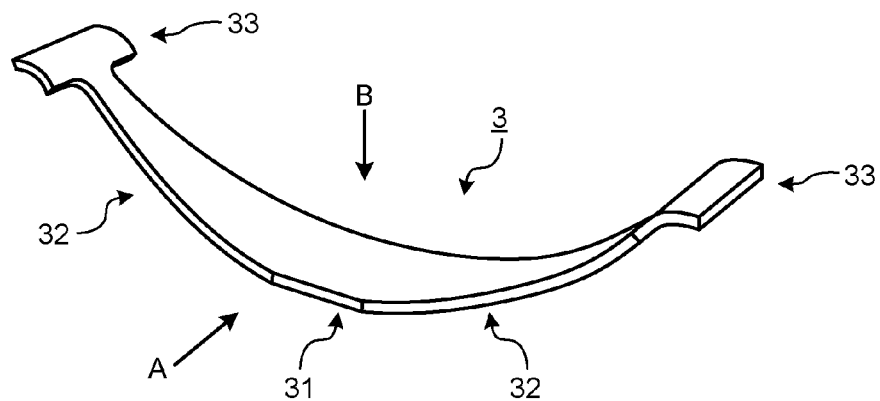
FIG. 7A is a perspective view of a spring member according to the second embodiment of the present invention.
Figure 7B:
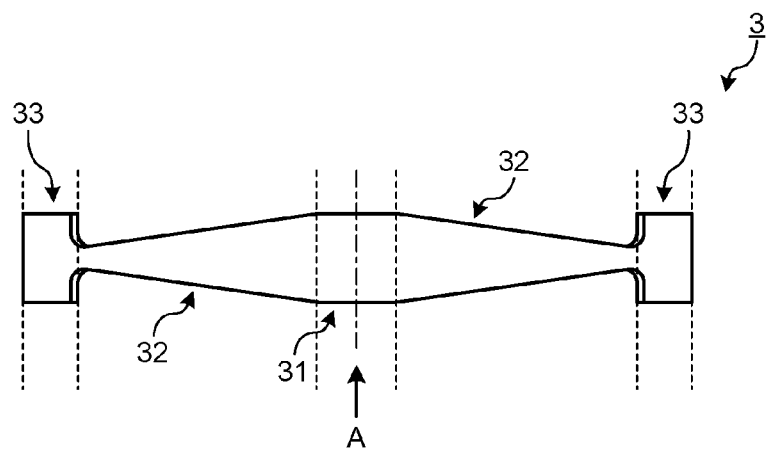
FIG. 7B is a plan view of the spring member illustrated in FIG. 7A when seen from an arrow B direction.
Figure 7C:
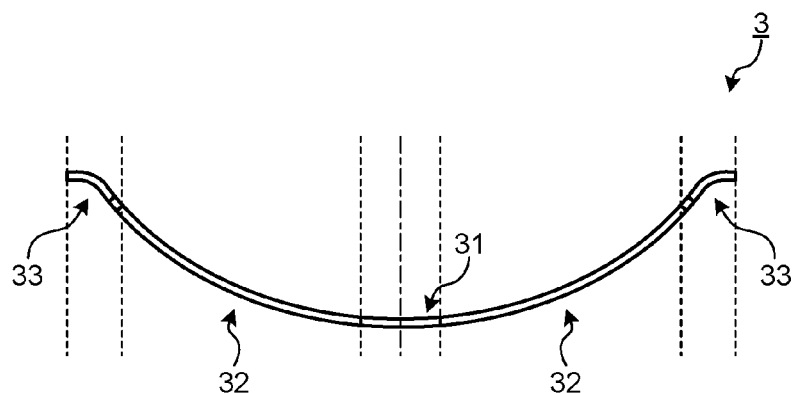
FIG. 7C is a side view of the spring member illustrated in FIG. 7A when seen from an arrow A direction.

FIG. 4 is a side view schematically illustrating a pressure unit which uses a pressure structure according to the second embodiment of the present invention. FIG. 5 is a perspective view of a first pressed body according to the second embodiment of the present invention. FIG. 6A is a perspective view in the state in which the pressure structure illustrated in FIG. 4 is provided in the first pressed body. FIG. 6B is a cross-sectional view taken along a line A-A of the state illustrated in FIG. 6A in which the pressure structure is provided in the first pressed body. FIG. 7A is a perspective view of a spring member according to the second embodiment of the present invention. FIG. 7B is a plan view of the spring member illustrated in FIG. 7A when seen from an arrow B direction. FIG. 7C is a side view of the spring member illustrated in FIG. 7A when seen from an arrow A direction.

As illustrated in FIG. 4, the pressure unit according to the second embodiment of the present invention is configured such that a pressure structure 200 is arranged between a first pressed body 201 and the second pressed body 102 which face each other. The pressure structure 200 applies a pressure to both the first pressed body 201 and the second pressed body 102 using the elastic force of a first spring member 3 and a second spring member 4.

As illustrated in FIG. 5, the first pressed body 201 is provided with positioning grooves 201a and 201b as the positioning unit configured to maintain the predetermined interval between the first spring member 3 and the second spring member 4 and to prevent the first spring member 3 and the second spring member 4 from being shifted in the width direction. Incidentally, the positioning grooves 201a and 201b may be provided on the second pressed body 102.

As illustrated in FIG. 6A, the positioning groove 201a is a groove with the predetermined depth, and is formed in an area on which an end portion 43 of the second spring member 4 abut in the surface of the first pressed body 201 which faces the second pressed body 102. The positioning groove 201a is set to have a size enabling the end portion 43 of the second spring member 4 to be slid into the positioning groove 201a in the longitudinal direction.

As illustrated in FIG. 6A, the positioning groove 201b is a groove with the predetermined depth, and is formed in an area on which a center portion 31 of the first spring member 3 abut in the surface of the first pressed body 201 which faces the second pressed body 102. The positioning groove 201b is set to have a size enabling the center portion 31 of the first spring member 3 to be fitted into the positioning groove 201b.

As illustrated in FIG. 6A, the pressure structure 200 is configured such that the first spring member 3 and the second spring member 4 are alternately arranged in the width direction to allow a part of a center portion 31 to overlap a part of a center portion 41 when seen from the top. The first spring member 3 is, for example, the leaf spring which is made of the metal material such as the spring steel or the resin material. As illustrated in FIGS. 7A to 7C, the first spring member 3 includes the center portion 31, which is in contact with the first pressed body 201, end portions 33, each of which is in contact with the second pressed body 102 to be slidable, and two arm portions 32 which extend from the center portion 31 toward the different end portions 33 and connect the center portion 31 and the end portions 33.

As illustrated in FIG. 6A, when the first spring member 3 and the second spring member 4 are alternately arranged in the width direction to allow the parts of the center portion 31 and the center portion 41 to overlap each other when seen from the top, the first spring member 3 has a shape from which an area which interferes with an arm portion 42 of the second spring member 4 is removed. For example, when seen from the top, the center portion 31 of the first spring member 3 has a quadrilateral shape with the largest width, and the arm portion 32 has an isosceles trapezoidal shape of which the width decreases continuously from a boundary portion against the center portion 31 to a boundary portion against the end portion 33 to be the minimum in the boundary portion against the end portion 33, or an isosceles triangular shape of which a bottom side is the boundary against the center portion 31 and an apex is in the end portion 33 while an apex angle portion in the boundary portion against the end portion 33 being cut. The end portion 33 has the same width as the center portion 31. The center portion 31 and the end portion 33 have the same width, and the width of the arm portion 32 decreases from the center portion 31 to the end portion 33, and thus, there is a constricted portion at the boundary portion between the arm portion 32 and the end portion 33. The width of the arm portion 32 of the first spring member 3 is set such that the arm portion 32 does not interfere with the arm portion 42 of the second spring member 4, which is arranged to partially overlap the arm portion 32 when seen from the top, even in a state in which a predetermined load is applied to deflect the arm portion 32 (when an assumable load is applied). Incidentally, the width of the arm portion 32 will be described below.

As illustrated in FIG. 7C, the first spring member 3 has a curved or bent shape, when seen from the side, such that the arm portions 32 face each other with the center portion 31 as the center thereof. That is, the first spring member 3 has a shape in which a spring height thereof is the highest at each contact point between both the end portions 33 and the second pressed body 102 and is the lowest at a contact point between the center portion 31 and first pressed body 201. Similarly to the first spring member 1 of the first embodiment, a pressure area, at which the first pressed body 201 serving as the pressed member is pressed, is positioned at the center portion 31 of the first spring member 3.

The second spring member 4 is, for example, the leaf spring which is made of the metal material such as the spring steel or the resin material. As illustrated in FIGS. 4 and 6B, the second spring member 4 includes a center portion 41, which is in contact with the second pressed body 102, end portions 43, each of which is in contact with the first pressed body 201 to be slidable, and two arm portions 42 which extend from the center portion 41 toward the different end portions 43 and connect the center portion 41 and the end portions 43.

The second spring member 4 has the same shape as the first spring member 3, and has a shape from which the area which interferes with the arm portion 32 of the first spring member 3 is removed in a case in which the first spring member 3 and the second spring member 4 are alternately arranged in the width direction to allow a part of the center portion 31 to overlap a part of the center portion 41 when seen from the top. Similarly to the second spring member 2 of the first embodiment, pressure areas, at which the first pressed body 201 serving as the pressed member is pressed, are positioned at both the end portions 43 of the second spring member 4.

The second spring member 4 is arranged in a direction to be reversed upside down (direction with the reversed curve direction) with respect to the first spring member 3. The second spring member 4 is arranged in the downward direction, and thus, the pressure areas, at which the first pressed body 201 serving as the pressed member is pressed, are positioned at both the end portions 43 of the second spring member 4, similarly to the second spring member 2 of the first embodiment.

Figure 8A:
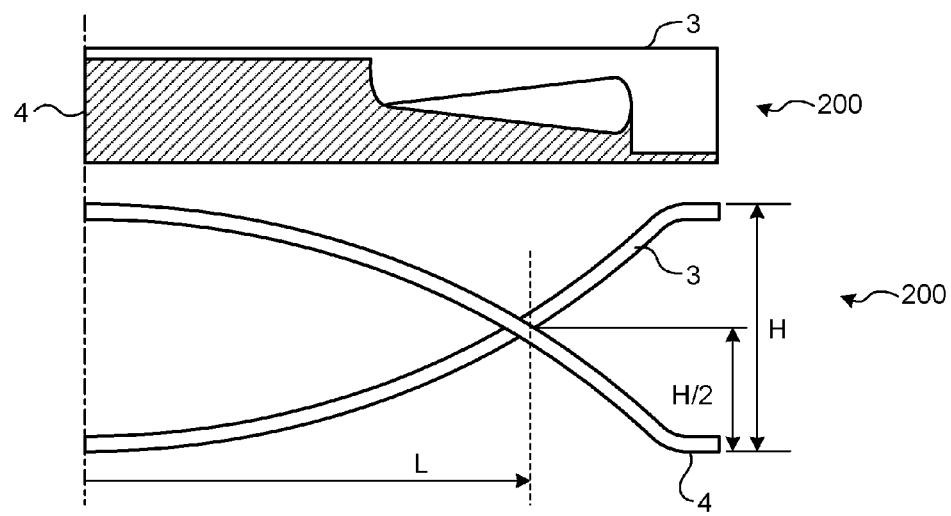
FIG. 8A is a plan view and a side view illustrating a position at which a first spring member and a second spring member interfere with each other at the time of mounting.
Figure 8B:
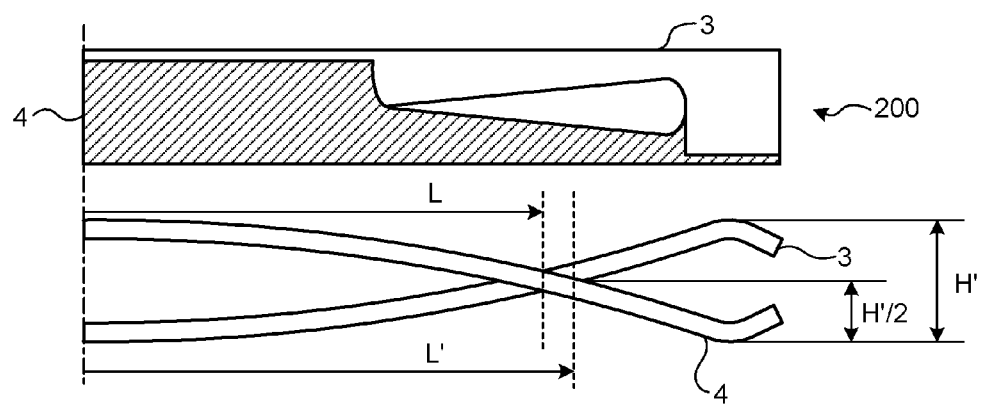
FIG. 8B is a plan view and a side view illustrating a position at which the first spring member and the second spring member interfere with each other at the time of deflection.

FIG. 8A is a plan view and a side view illustrating a position at which the first spring member and the second spring member interfere with each other at the time of mounting. FIG. 8B is a plan view and a side view illustrating a position at which the first spring member and the second spring member interfere with each other at the time of deflection.

Each point at which the adjacently arranged first and second spring members 3 and 4 may interfere with each other in the arm portions 32 and 42 is a location at which each spring height H of the first spring member 3 and the second spring member 4 becomes a half. Hereinafter, a distance, between the center of the first spring member 3 or the second spring member 4 in the longitudinal direction and the location (H/2) at which the spring height H becomes a half at the time of mounting (under non-load), will be set as L as illustrated in FIG. 8A. In addition, a plate width of the first spring member 3 or the second spring member 4 at the distance L will be set as a width B.

In addition, a distance, between the center of the first spring member 3 or the second spring member 4 in the longitudinal direction and the location (H'/2) at which a spring height H' becomes a half at the time of deflection (under the assumed load), will be set as L' as illustrated in FIG. 8B. At this time, the distance L' is constantly larger than the distance L. Accordingly, it may be enough when a plate width B' of each of the first spring member 3 and the second spring member 4 is smaller than a predetermined value (the width B) at a position which is far from at least the distance L from the center in the longitudinal direction in order to avoid the interference at the time of deflection. Preferably, the plate width of each of the first spring member 3 and the second spring member 4 is set to be narrower than the predetermined value (width B) between the distance L and the distance L'.

Figure 9A:
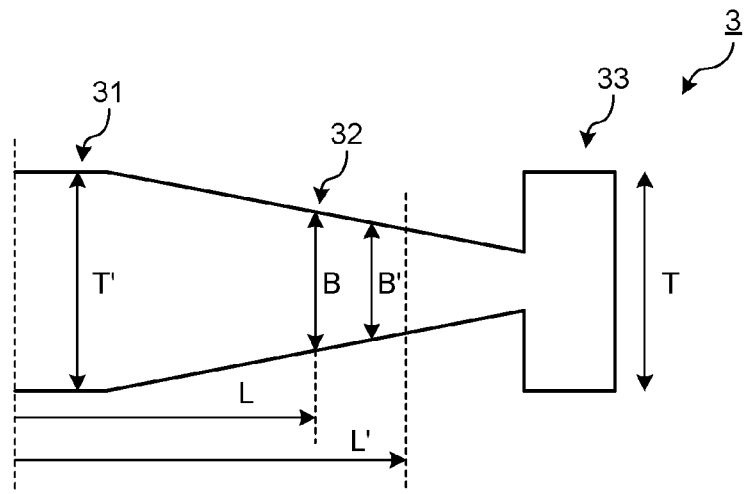
FIG. 9A is a plan view for describing a condition that the first spring member and the second spring member do not interfere with each other.
Figure 9B:
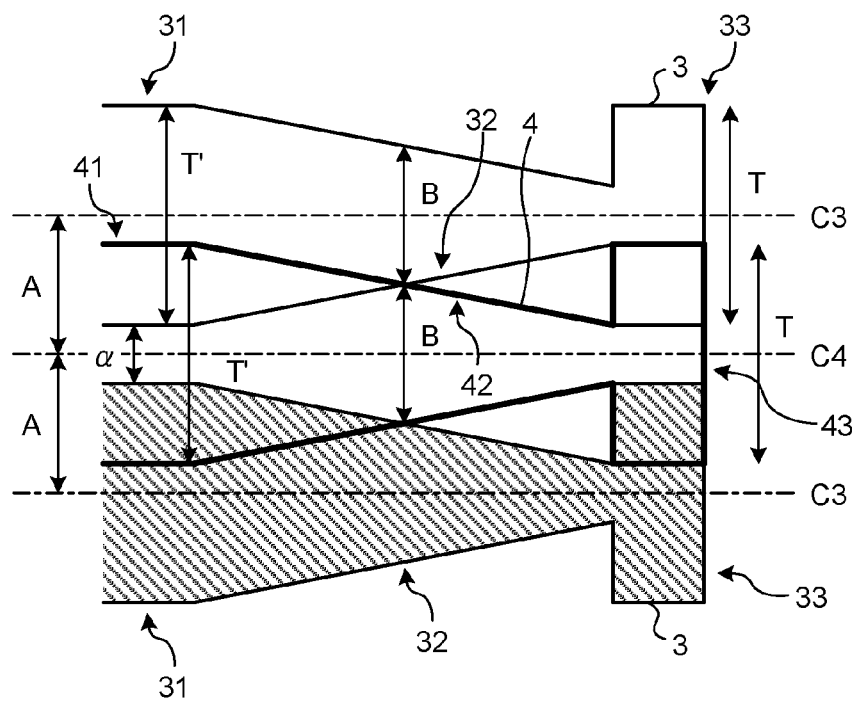
FIG. 9B is a plan view for describing a condition that the first spring member and the second spring member do not interfere with each other.

FIGS. 9A and 9B are plan views for describing a condition that the first spring member and the second spring member do not interfere with each other.

As illustrated in FIG. 9A, a plate width of the center portion 31 of the first spring member 3 is set as T', a plate width of the end portion 33 is set as T, and the plate width of the arm portion 32 at the location corresponding to the half of the spring height H of the first spring member 3, that is, at the distance L illustrated in FIGS. 8A and 8B is set as the width B. Similarly, the plate width of the center portion 41 of the second spring member 4 is set as T', the plate width of the end portion 43 is set as T, and the plate width of the arm portion 42 at the location corresponding to the half of the spring height H of the second spring member 4, that is, at the distance L illustrated in FIGS. 8A and 8B is set as the width B.

In addition, when the first spring member 3 and the second spring member 4 are arranged side by side to allow a part of the center portion 31 to overlap a part of the center portion 41 as illustrated in FIG. 9B, a shift amount (pitch) between a center C3 of the first spring member 3 in the width direction and a center C4 of the second spring member 4 in the width direction is set as A. At this time, the clearance α can be obtained as α=2A−T'.

It is necessary to satisfy the following three conditions in order that the first spring member 3 and the second spring member 4, which are arranged to partially overlap each other at the center portions 31 and 41, do not interfere with each other in the arm portions 32 and 42. First, the width B is necessarily set to be smaller than the shift amount A (B<A). Next, a half of the plate width T of each of the end portions 33 and 43 is necessarily set to be smaller than the shift amount A (T/2<A). Further, a half of the plate width T' of each of the center portions 31 and 41 is necessarily set to be smaller than the shift amount A (T'/2<A).

In the second embodiment, the arm portions 32 and 42 are formed in a shape in which the width thereof decreases linearly from the center portion toward the end portion as illustrated in FIG. 7B in order to satisfy the above-described conditions, and the plate width of each of the first spring member 3 and the second spring member 4 is smaller than the shift amount A between the distance L and the distance L'. Through the above-described setting, it is possible to arrange the first spring member 3 and the second spring member 4 side by side to allow a part of the center portion 31 to overlap a part of the center portion 41.

Incidentally, the arm portions 32 and 42 are not limited to the shape in which the width decreases linearly from the center portion toward the end portion as illustrated in FIG. 7B, but may have a shape in which the plate width B' is equal to or less than the width B (less than the shift amount A) between the distance L and the distance L'. For example, the arm portions 32 and 42 may have a shape in which the width thereof decreases along a curved line from the center portion toward the end portions 33 and 43, and may have a shape in which the width is equal to or less than the width B only between the distance L and the distance L', and the plate width increases again between the distance L' and the end portions 33 and 43.

Figure 10:
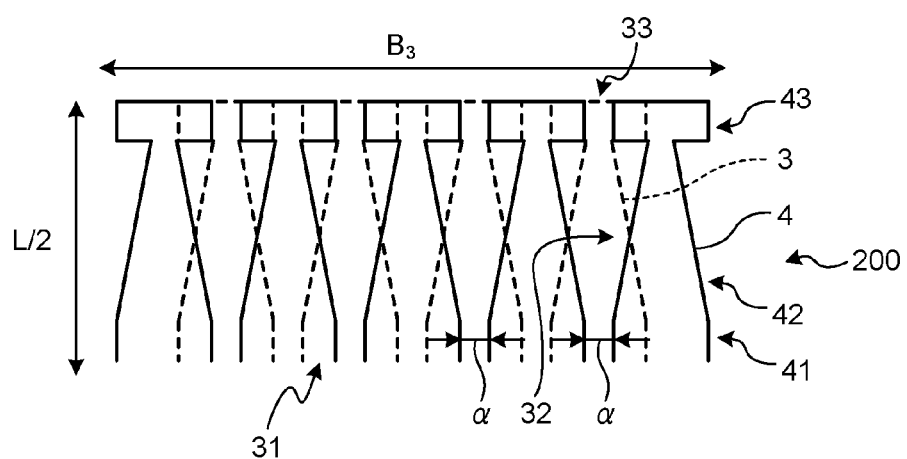
FIG. 10 is a plan view schematically illustrating an arrangement area in a case in which nine spring members are arranged side by side in the second embodiment.

FIG. 10 is a plan view schematically illustrating an arrangement area in a case in which the nine spring members are arranged side by side in the second embodiment. In the pressure structure 200 illustrated in FIG. 10, the four first spring members 3 and the five second spring members 4 are alternately arranged side by side in the width direction to partially overlap each other when seen from the top. Incidentally, the predetermined interval (clearance α) is provided between the first spring member 3 and the second spring member 4.

Here, when a width (maximum width) of each of the first spring member 3 and the second spring member 4 illustrated in FIG. 10 is set to be 20 mm and the clearance α is set to be 0.4 mm, a width $B_3$ of the pressure structure 200 satisfies $B_3=(20\times5)+(4\times0.4)=101.6$ mm. In addition, when the entire length L of the pressure structure 200 is set to be 50 mm and each spring load F of the first spring member 1 and the second spring member 2 is set to be 1000 N, it is found out that a load per unit area $P_3$ [N/mm$^2$] is 1.77 [N/mm$^2$] by the following Formula (6).

$$P_3=(1000\times9)/(101.6\times50)=1.77\ [N/mm^2] \tag{6}$$

Considering that load per unit area $P_1$ is 1.00 [N/mm$^2$] in a case in which the spring member is not divided as illustrated in FIG. 3A (when the pressure structure is configured of the single spring member), the load per unit area $P_3$ in the substantially same area is significantly improved to be 1.77 [N/mm$^2$] in the pressure structure 200 illustrated in FIG. 10. It is found out that the uniformity of the surface pressure can be achieved in the pressure structure 200 without decreasing the load per unit area $P_3$.

In addition, the load per unit area $P_3$ in the substantially same area is significantly improved to be 1.77 [N/mm$^2$] in the pressure structure 200 illustrated in FIG. 10 considering that the load per unit area $P_2$ is 0.98 [N/mm$^2$] when the first spring member 1 and the second spring member 2 are arranged without an overlap as illustrated in FIG. 3B. In addition, the number of the pressure areas is also increased since the number of the spring members is increased from five to nine as compared to the example illustrated in FIG. 3B, and it is possible to achieve the further uniformity of the surface pressure as compared to the first embodiment. Accordingly, it is found out that the uniformity of the surface pressure can be achieved in the pressure structure 200 without decreasing the load per unit area $P_3$.

As described above, the pressure structure 200 is configured such that the first spring member 3 in the upward direction and the second spring member 4 in the downward direction are alternately arranged in the width direction to partially overlap each other, when seen from the top, according to the second embodiment. Accordingly, the pressure areas against the first pressed body 201 and the second pressed body 102 are dispersed to the center portion and both the end portions, and thus, the surface pressure distribution is uniformized. In addition, since the first spring member 3 in the upward direction and the second spring member 4 in the downward direction are arranged to allow the part (the part of the center portion 31 with the maximum width) to overlap the part (the part of the center portion 41 with the maximum width) when seen from the top, it is possible to prevent the decrease of the spring load per unit area by increasing the number of the spring members which are arranged in the same area.

Modification Example of Second Embodiment

Figure 11:
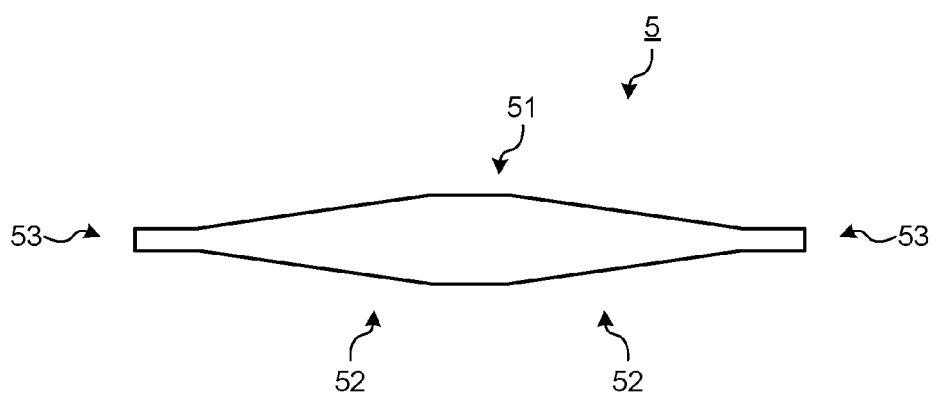
FIG. 11 is a plan view illustrating a shape of a spring member according to a modification example of the second embodiment of the present invention when seen from the top.

FIG. 11 is a plan view illustrating a shape of a spring member according to a modification example of the second embodiment of the present invention when seen from the top. A spring member 5 according to the modification example of the second embodiment may be used as the first spring member 3 or the second spring member 4 in the second embodiment.

The widths of the end portion 33 and the end portion 43 are set to be equal to the widths of the center portion 31 and the center portion 41, respectively, in the first spring member 3 and the second spring member 4 according to the second embodiment in order to avoid a damage of the first pressed body 201 or the second pressed body 102, so that a pressure per unit area is decreased in the contact surface between the end portion 33 or the end portion 43, and the first pressed body 201 or the second pressed body 102, but there is no need of setting the width of the end portion as described above in a case in which the first pressed body 201 or the second pressed body 102 is robust, and thus, a width of an end portion 53 may be set to be narrower than a width of a center portion 51 like the end portion 53 of the spring member 5 according to the modification example of the second embodiment.

In the example of FIG. 11, the width of the end portion 53 is set to be equal to that of a part (boundary portion against the end portion 53) in which a width of an arm portion 52 is the narrowest. Although it is necessary that the first spring member 3 and the second spring member 4 are alternately arranged at the time of the assembly of the pressure structure 200 in a case in which the widths of the end portion 33 and the end portion 43 are equal to the widths of the center portion 31 and the center portion 41 as in the second embodiment, when any one of the first spring member 3 and the second spring member 4 is set as the spring member 5 according to the modification example of the second embodiment, and the width of the end portion 53 is set to be equal to that of the portion in which the width of the arm portion 52 is the narrowest (boundary portion against the end portion 53), it is possible to arrange all the other spring members, and then, arrange the spring member 5 to pass through the clearances thereof, and thus, the pressure structure can be easily assembled.

Incidentally, an end portion member, which is made of a metal material or a resin material, may be mounted as a separate body to the end portion 53 of the spring member 5 having the shape illustrated in FIG. 11. The end portion member is set to have the same shape as, for example, that of the end portion 33 of the first spring member 3 of the second embodiment.

Third Embodiment

The positioning grooves 201a and 201b are provided in the first pressed body 201 or the second pressed body 102 in order to position the first spring member 3 and the second spring member 4 in the second embodiment, but in a third embodiment, a positioning tube is used as the positioning unit.

A first spring member 6 and a second spring member 7 used in the third embodiment are the same members as the first spring member 3 and the second spring member 4 according to the second embodiment respectively, and thus, the description thereof will be omitted. In addition, it is possible to replace any one of the first spring member 6 and the second spring member 7 with the spring member 5 according to the modification example of the second embodiment.

Figure 12:
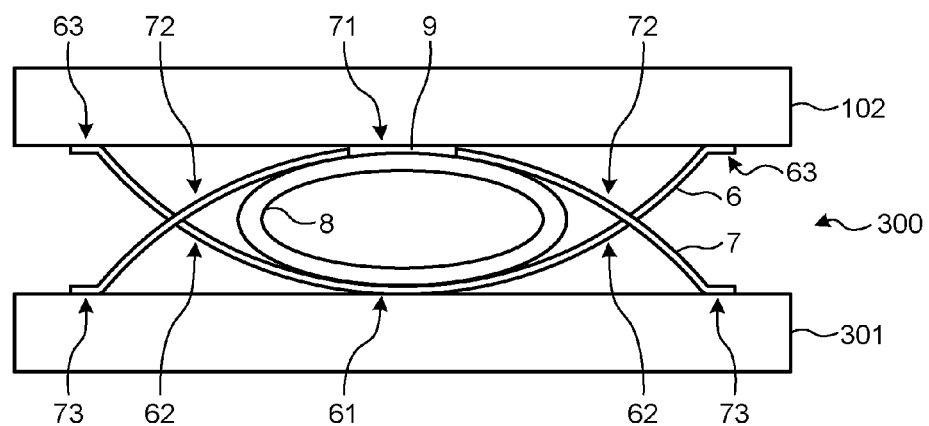
FIG. 12 is a side view schematically illustrating a pressure unit which uses a pressure structure according to a third embodiment.
Figure 13:
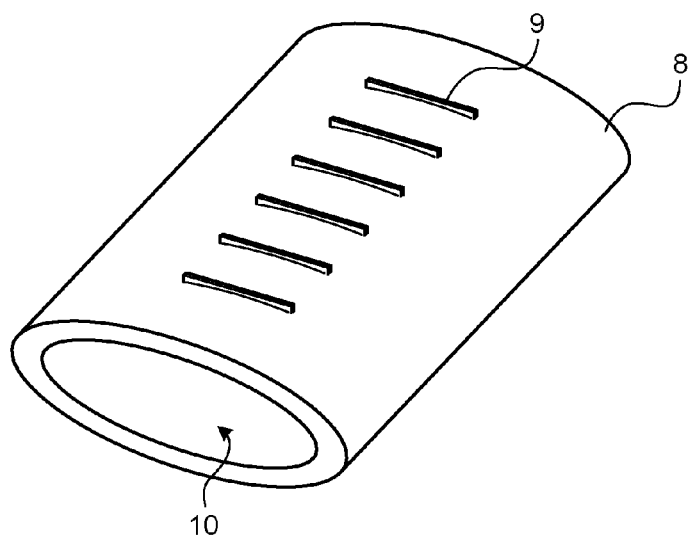
FIG. 13 is a perspective view of a positioning tube according to the third embodiment.
Figure 14:
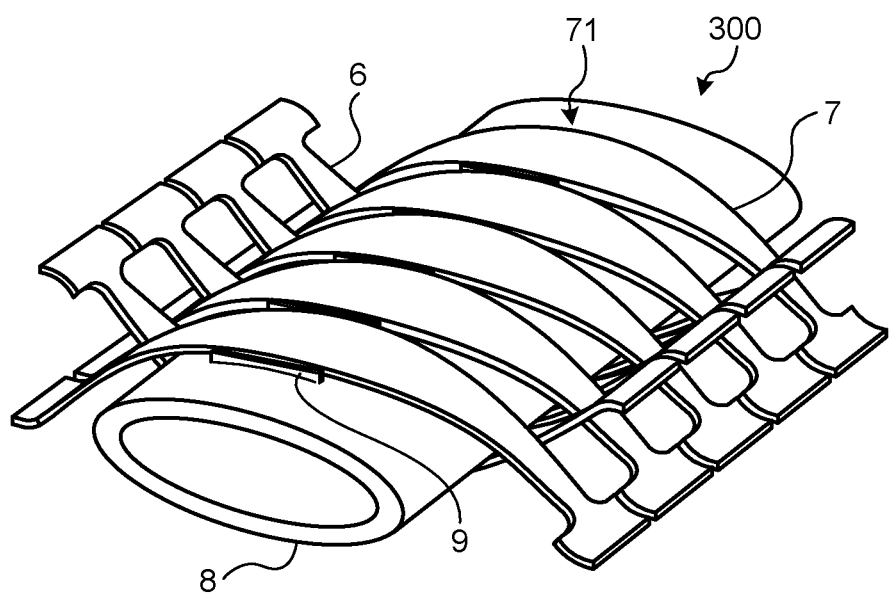
FIG. 14 is a perspective view of a pressure structure according to the third embodiment.
Figure 15A:
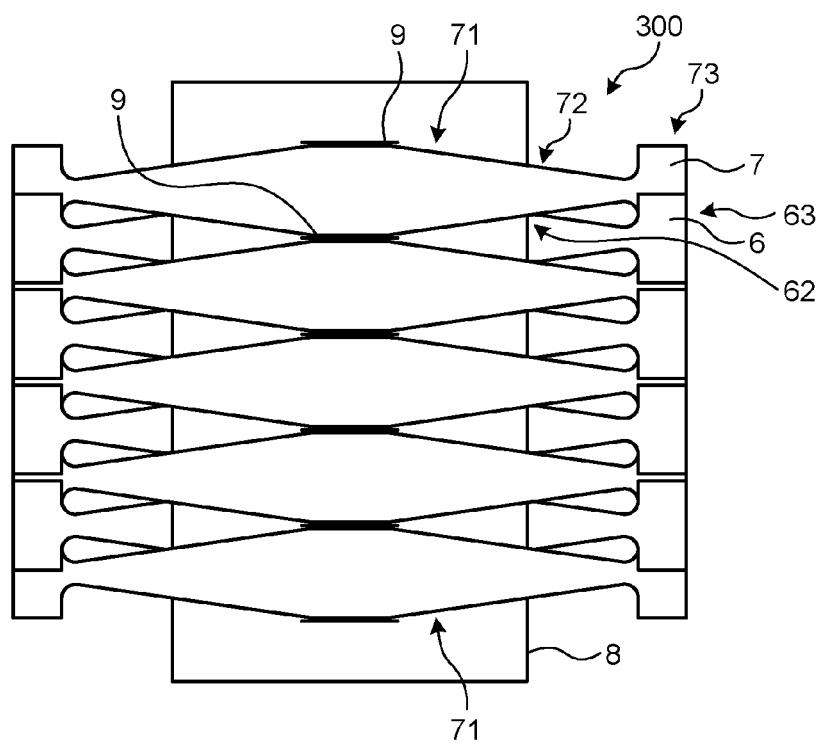
FIG. 15A is a plan view illustrating the pressure structure according to the third embodiment when seen from the top.
Figure 15B:
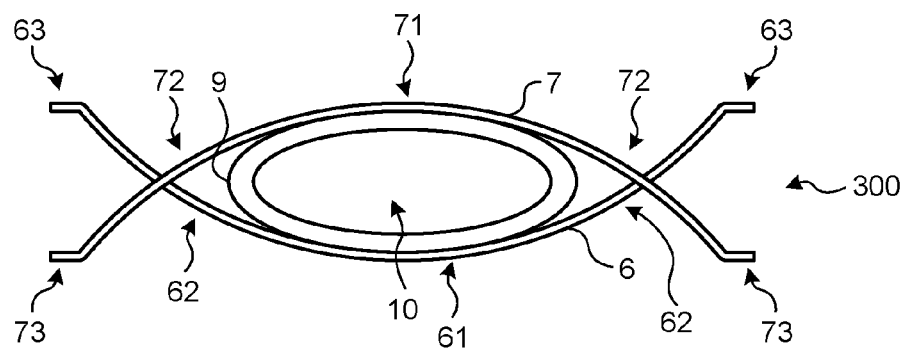
FIG. 15B is a side view of the pressure structure according to the third embodiment.

FIG. 12 is a side view schematically illustrating a pressure unit which uses a pressure structure according to the third embodiment. FIG. 13 is a perspective view of the positioning tube according to the third embodiment. FIG. 14 is a perspective view of the pressure structure according to the third embodiment. FIG. 15A is a plan view illustrating the pressure structure according to the third embodiment when seen from the top. FIG. 15B is a side view of the pressure structure according to the third embodiment.

As illustrated in FIG. 12, the pressure unit according to the third embodiment of the present invention is configured such that a pressure structure 300 is arranged between a first pressed body 301 and the second pressed body 102 which face each other. The pressure structure 300 applies a pressure to both the first pressed body 301 and the second pressed body 102 using the elastic force of the first spring member 6 and the second spring member 7.

A positioning tube 8 is made of, for example, a rubber material or a flexible resin material, is a tubular member in which a hollow portion 10 is formed, and has protrusions (ribs) 9 for positioning the first spring member 6 and the second spring member 7 on the surface thereof. The protrusions 9 are provided with an equal interval on both of an upper surface and a lower surface of the positioning tube 8. The protrusions 9 extend in parallel with the longitudinal direction of center portions 61 and 71 of the first spring member 6 and the second spring member 7, and the first spring member 6 or the second spring member 7 is nipped between the two adjacent protrusions 9, and accordingly, the movement of the first spring member 6 or the second spring member 7 in the width direction is suppressed. Thus, the interval between the adjacent protrusions 9 is set be slightly wider than a width of the first spring member 6 or the second spring member 7 which is arranged between the adjacent protrusions. In addition, the width of the protrusion 9 is set to be equal to an interval between the first spring member 6 and the second spring member 7. In addition, the positioning tube 8 has the hollow portion 10 so as to prevent the first spring member 6 and the second spring member 7 from affecting the spring load. The positioning tube 8 is inserted into a space to be formed between the center portion 61 of the first spring member 6 and the center portion 71 of the second spring member 7.

Even in the third embodiment, the pressure structure 300 is configured such that the first spring member 6 in the upward direction and the second spring member 7 in the downward direction are alternately arranged in the width direction to partially overlap each other, when seen from the top, as illustrated in FIGS. 14 and 15A. Thus, it is possible to achieve the uniformity of the surface pressure similarly to the second embodiment, and further, it is possible to prevent the decrease of the spring load per unit area even when the number of the spring members is increased.

In the third embodiment, the positioning tube 8 is used for positioning of the first spring member 6 and the second spring member 7, and thus, it is not necessary to provide the positioning unit in the first pressed body 301. Thus, a particular process for the pressed member is not necessary. Incidentally, the second pressed body 102 may be also configured using the pressed member similarly to the first pressed body 301. It is also unnecessary to provide the positioning unit in the second pressed body 102.

Fourth Embodiment

Figure 16:
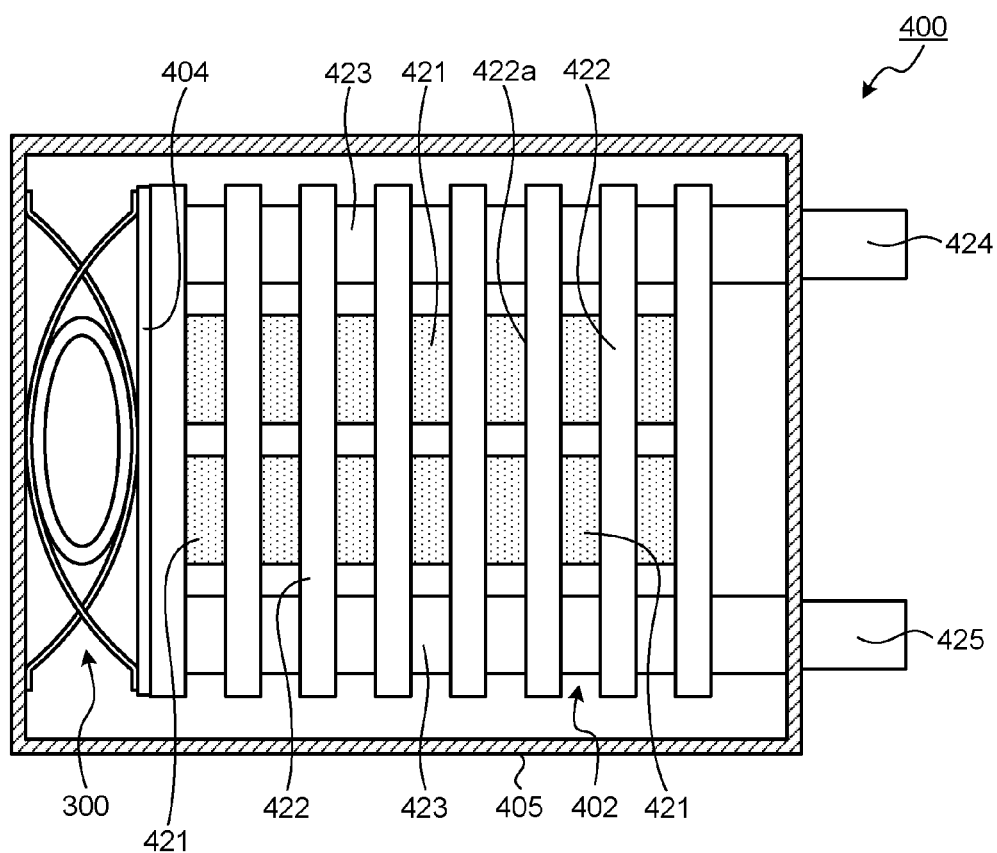
FIG. 16 is a diagram schematically illustrating a configuration of a main portion of a power conversion device according to a fourth embodiment of the present invention.

FIG. 16 is a diagram schematically illustrating a configuration of a main portion of a power conversion device according to a fourth embodiment of the present invention. In the fourth embodiment, the power conversion device serving as the pressure unit is described as an application example of the pressure structure. A power conversion device 400 illustrated in FIG. 16 is, for example, a device that generates driving current which flows to a driving motor for an electric vehicle. Incidentally, the power conversion device which includes the above-described pressure structure 300 of the third embodiment will be described in the following example, but the power conversion device may include the pressure structure 100 according to first embodiment or the pressure structure 200 according to the second embodiment.

The power conversion device 400 includes a semiconductor stacked unit (first pressed body) 402, which includes a semiconductor element, a pressure structure 300 which applies a pressure to the semiconductor stacked unit 402 from one side surface of the semiconductor stacked unit 402, a flat-plate abutting plate 404, which is interposed between the semiconductor stacked unit 402 and the pressure structure 300, and a housing 405 (second pressed body) which accommodates the semiconductor stacked unit 402, the pressure structure 300, and the abutting plate 404. The power conversion device 400 includes a control circuit to control semiconductor modules 421 and the like, in addition to the constituent components illustrated in FIG. 16.

The semiconductor stacked unit 402 has a configuration in which the semiconductor modules 421 and cooling tubes 422 are alternately stacked. In the case of the configuration illustrated in FIG. 16, the two semiconductor modules 421 are arranged between the adjacent cooling tubes 422 along the stacking direction.

The semiconductor module 421 is formed in an integrated manner such that an IGBT element for power supply and a flywheel diode element, which is provided to smoothly rotate a motor, are arranged between a pair of heat dissipation plates, and then, sealed by resin so as to allow the pair of heat dissipation plates to be exposed.

The cooling tube 422 is a flat tube which includes a refrigerant flow path therein. A natural refrigerant such as water and ammonia, water mixed with an ethylene glycol-based antifreeze solution, a carbon fluoride-based refrigerant such as fluorinate, a fluorocarbon-based refrigerant such as HCFC123 and HFC134a, an alcohol-based refrigerant such as methanol and alcohol, or a ketone-based refrigerant such as acetone is distributed in the refrigerant flow path.

The plurality of cooling tubes 422 are coupled to one another through coupling pipes 423 extending along the stacking direction of the semiconductor stacked unit 402. A refrigerant introduction port 424 and a refrigerant discharge port 425, which are connected to the cooling tubes 422 arranged on the respective end portions of the coupling pipes 423, are provided at the end portions of the coupling pipes 423. The cooling tubes 422, the coupling pipes 423, the refrigerant introduction port 424, and the refrigerant discharge port 425 are realized using, for example, aluminum.

Main surfaces 422a of the cooling tubes 422 are brought into close contact with the heat dissipation plates of the semiconductor modules 421 by a pressure force from the pressure structure 300. This makes it possible to perform heat exchange between the semiconductor modules 421 and the cooling tubes 422.

As above, according to the fourth embodiment, it is possible to uniformly press the semiconductor stacked unit 402 in plane with a sufficient pressure force in the stacking direction using the pressure structure 300. Accordingly, it is possible to improve the cooling efficiency in the semiconductor stacked unit 402 using the cooling tubes 422.

Fifth Embodiment

Figure 17:
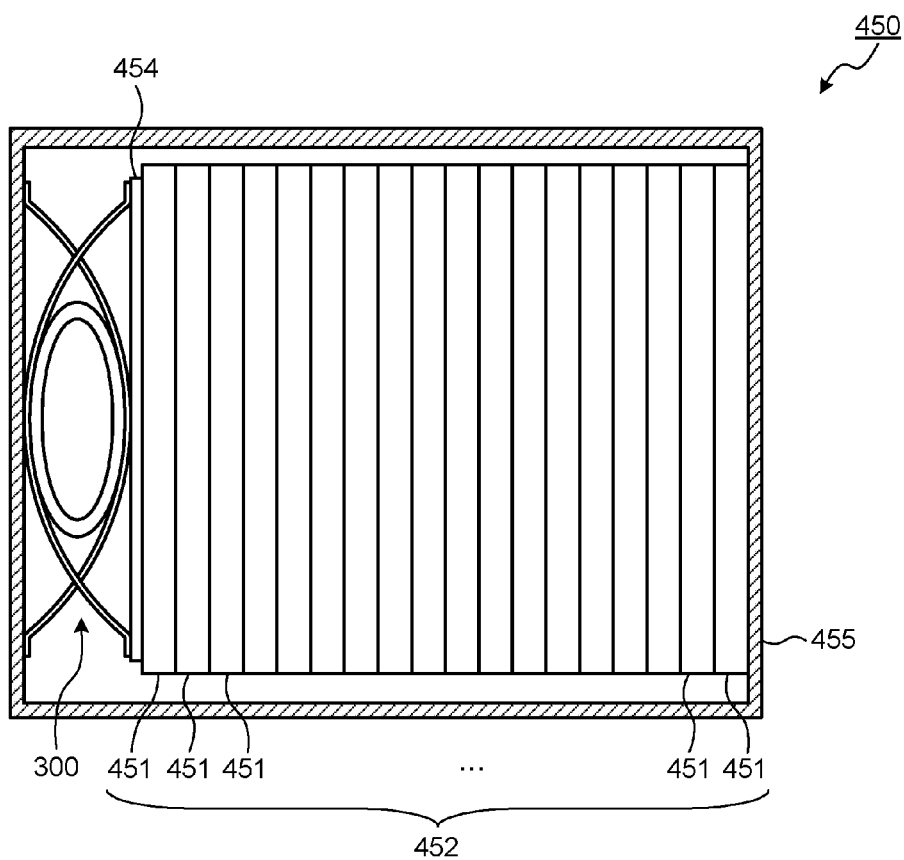
FIG. 17 is a diagram schematically illustrating a configuration of a main portion of an electric double layer capacitor according to a fifth embodiment of the present invention.
Figure 18A:
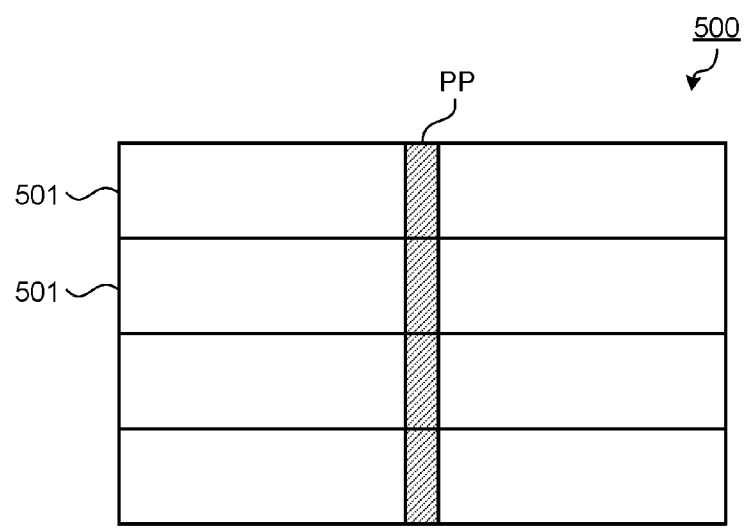
FIG. 18A is a plan view illustrating an arrangement example of leaf springs in a conventional pressure structure.
Figure 18B:
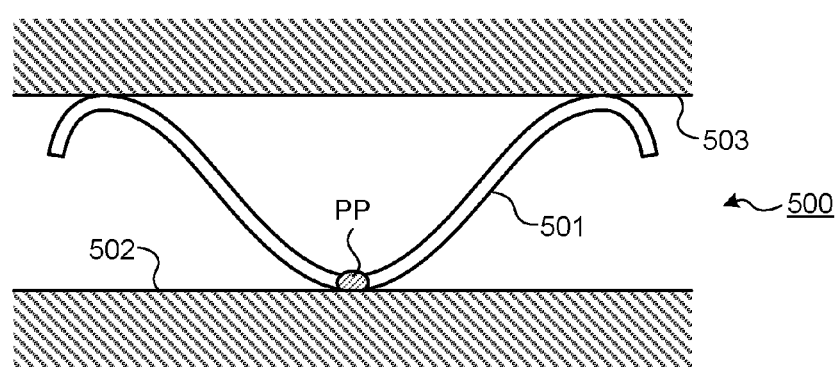
FIG. 18B is a side view illustrating a pressure unit which uses the conventional pressure structure illustrated in FIG. 18A.

FIG. 17 is a diagram schematically illustrating a configuration of a main portion of an electric double layer capacitor according to a fifth embodiment of the present invention. In the fifth embodiment, the electric double layer capacitor serving as the pressure unit is described as an application example of the pressure structure. Incidentally, the pressure unit which includes the pressure structure 300 of the above-described third embodiment is described in the following example, but the pressure structure 100 according to the first embodiment or the pressure structure 200 according to the second embodiment may be used.

An electric double layer capacitor 450 according to the fifth embodiment of the present invention includes a cell stacked body (first pressed body) 452, which includes a plurality of package cells 451, the pressure structure 300, which applies a pressure to the cell stacked body 452 from one side surface, a flat-plate abutting plate 454, which is interposed between the cell stacked body 452 and the pressure structure 300, and a housing (second pressed body) 455 which accommodates the cell stacked body 452, the pressure structure 300, and the abutting plate 454. The electric double layer capacitor 450 includes a connection terminal with the external circuit, and the like in addition to the constituent components illustrated in FIG. 17. The cell stacked body 452 is electrically connected to the connection terminal with the external circuit.

The cell stacked body 452 is configured such that the plurality of the package cells 451 are stacked. Each of the package cells 451 has an innermost layer and an outermost layer, each of which is made of an insulation film, and includes a positive electrode collector and a negative electrode collector. Each of the package cells 451 accommodates the stacked body, in which the plurality of the electrode collectors overlapping with the separator interposed therebetween, and an electrolyte therein. The positive electrode terminal and the negative electrode terminal of each electrode collector are connected to the positive electrode collector and the negative electrode collector. The plurality of the package cell 451 are connected with each other in series in such a manner that the positive electrode collectors and the negative electrode collectors of adjacent package cells 451 are coupled to each other through the connection terminal.

As above, the pressure structure 300 applies a pressure to the stacked body 452 of the electric double layer capacitor 450 in the stacking direction to restrain the expansion of a polarizable electrode according to the fifth embodiment, and accordingly, it is possible to improve the energy density per unit volume.

Incidentally, the first spring member and the second spring member may have different shapes, although having the same shape in the above-described first to fifth embodiments. For example, the plate width of the first spring member may be made different from that of the second spring member.

In addition, although the power conversion device is exemplified as the pressure unit which is necessary to be pressed by the pressure structure in the above-described fourth embodiment, and in the above-described fifth embodiment, the electric double layer capacitor is exemplified as the pressure unit which is necessary to be pressed by the pressure structure, the pressure unit to which the pressure structure according to the first to third embodiments is applied may be adapted as long as the pressure structure may be arranged between the first pressed body and the second pressed body so that the pressure structure applies a pressure to the first pressed body and the second pressed body.

REFERENCE SIGNS LIST 1, 3, 6 FIRST SPRING MEMBER
2, 4, 7 SECOND SPRING MEMBER
5 SPRING MEMBER
8 POSITIONING TUBE
9 PROTRUSION
10 HOLLOW PORTION
11, 21, 31, 41, 51, 61, 71 CENTER PORTION
12, 22, 32, 42, 52, 62, 72 ARM PORTION
13, 23, 33, 43, 53, 63, 73 END PORTION
100, 200, 300 PRESSURE STRUCTURE
101, 201, 301 FIRST PRESSED BODY
201$A$, 201$B$ POSITIONING GROOVE
102 SECOND PRESSED BODY
400 POWER CONVERSION DEVICE
402 SEMICONDUCTOR STACKED UNIT
404 ABUTTING PLATE
405 HOUSING
421 SEMICONDUCTOR MODULE
422 COOLING TUBE
423 COUPLING PIPE
424 REFRIGERANT INTRODUCTION PORT
425 REFRIGERANT DISCHARGE PORT
450 ELECTRIC DOUBLE LAYER CAPACITOR
451 PACKAGE CELL
452 CELL STACKED BODY
454 ABUTTING PLATE
455 HOUSING

The invention claimed is:

1. A pressure structure that is arranged between a first pressed body and a second pressed body facing the first pressed body and applies a pressure to the first pressed body and the second pressed body, the pressure structure comprising:
a first spring member including:
a center portion which is in contact with the first pressed body;
two end portions, each of which is in contact with the second pressed body; and
two arm portions which extend from the center portion toward the different end portions; and
a second spring member including:
a center portion which is in contact with the second pressed body;
two end portions, each of which is in contact with the first pressed body; and
two arm portions which extend from the center portion toward the different end portions, wherein
the first spring member and the second spring member are alternately arranged in their width directions to allow a part of the center portion of the first spring member to overlap a part of the center portion of the second spring member when seen from the first or second pressed body, and the first spring member and the second spring member have shapes in which the respective arm portions thereof do not interfere with each other at least without a load.

2. The pressure structure according to claim 1, wherein the first spring member and the second spring member are alternately arranged in their width directions.

3. The pressure structure according to claim 1, wherein each of the arm portions of the first spring member and the second spring member includes a part with a width narrower than a width of the center portion.

4. The pressure structure according to claim 1, wherein each of the first spring member and the second spring member has a shape in which each width of the arm portions decreases from the center portion toward the end portion.

5. The pressure structure according to claim 1, wherein the first spring member and the second spring member have a same shape.

6. The pressure structure according to claim 1, further comprising:
a positioning unit configured to position the first spring member and the second spring member.

7. The pressure structure according to claim 6, wherein the positioning unit is inserted into a space formed between the center portion of the first spring member and the center portion of the second spring member.

8. A pressure unit comprising:
a first pressed body;
a second pressed body facing the first pressed body; and
a pressure structure that is arranged between the first pressed body and the second pressed body, and applies a pressure to the first pressed body and the second pressed body, the pressure structure including:
a first spring member including:
a center portion which is in contact with the first pressed body;
two end portions, each of which is in contact with the second pressed body; and
two arm portions which extend from the center portion toward the different end portions; and
a second spring member including:
a center portion which is in contact with the second pressed body;
two end portions, each of which is in contact with the first pressed body; and
two arm portions which extend from the center portion toward the different end portions, wherein
the first spring member and the second spring member are alternately arranged in their width directions to allow a part of the center portion of the first spring member to overlap a part of the center portion of the second spring member when seen from the first or second pressed body, and
the first spring member and the second spring member have shapes in which the respective arm portions thereof do not interfere with each other at least without a load.

9. The pressure unit according to claim 8, wherein the first spring member and the second spring member are alternately arranged in their width directions.

10. The pressure unit according to claim 8, wherein each of the arm portions of the first spring member and the second spring member includes a part with a width narrower than a width of the center portion.

11. The pressure unit according to claim 8, wherein each of the first spring member and the second spring member has a shape in which each width of the arm portions decreases from the center portion toward the end portion.

12. The pressure unit according to claim 8, wherein the first spring member and the second spring member have a same shape.

13. The pressure unit according to claim 8, wherein the pressure structure further including a positioning unit configured to position the first spring member and the second spring member.

14. The pressure unit according to claim 13, wherein the positioning unit is inserted into a space formed between the center portion of the first spring member and the center portion of the second spring member.

15. A pressure structure that is arranged between a first pressed body and a second pressed body facing the first pressed body and applies a pressure to the first pressed body and the second pressed body, the pressure structure comprising:
a first spring member including:
a center portion which is in contact with the first pressed body;
two end portions, each of which is in contact with the second pressed body; and
two arm portions which extend from the center portion toward the different end portions;
a second spring member including:
a center portion which is in contact with the second pressed body;
two end portions, each of which is in contact with the first pressed body; and
two arm portions which extend from the center portion toward the different end portions; and
a positioning unit configured to position the first spring member and the second spring member, the positioning unit being inserted into a space formed between the center portion of the first spring member and the center portion of the second spring member.

16. A pressure unit comprising:
a first pressed body;
a second pressed body facing the first pressed body; and
a pressure structure that is arranged between the first pressed body and the second pressed body, and applies a pressure to the first pressed body and the second pressed body, the pressure structure including:
a first spring member including:
a center portion which is in contact with the first pressed body;
two end portions, each of which is in contact with the second pressed body; and
two arm portions which extend from the center portion toward the different end portions;
a second spring member including:
a center portion which is in contact with the second pressed body;
two end portions, each of which is in contact with the first pressed body; and
two arm portions which extend from the center portion toward the different end portions; and
a positioning unit configured to position the first spring member and the second spring member, the positioning unit being inserted into a space formed between the center portion of the first spring member and the center portion of the second spring member.

* * * * *